(12) United States Patent
Lim

(10) Patent No.: US 7,633,104 B2
(45) Date of Patent: Dec. 15, 2009

(54) CMOS IMAGE SENSOR

(75) Inventor: Su Lim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 63 days.

(21) Appl. No.: 11/616,753

(22) Filed: Dec. 27, 2006

(65) Prior Publication Data

US 2007/0145442 A1    Jun. 28, 2007

(30) Foreign Application Priority Data

Dec. 28, 2005   (KR) .................. 10-2005-0132718

(51) Int. Cl.
*H01L 27/146* (2006.01)
(52) U.S. Cl. .............. 257/291; 257/440; 257/E27.135
(58) Field of Classification Search ......... 257/290–292, 257/440, 443, E27.13, E27.134, E27.135
See application file for complete search history.

(56) References Cited

U.S. PATENT DOCUMENTS 5,283,460 A * 2/1994 Mita .......................... 257/432
6,750,489 B1 * 6/2004 Merrill ....................... 257/292
2002/0058353 A1   5/2002 Merrill
2005/0077571 A1 * 4/2005 Kanda et al. ................ 257/337

FOREIGN PATENT DOCUMENTS

JP        H13-168313        6/2001

* cited by examiner

*Primary Examiner*—Sue Purvis
*Assistant Examiner*—W. Wendy Kuo
(74) *Attorney, Agent, or Firm*—Sherr & Vaughn, PLLC

(57) ABSTRACT

Embodiments relate to a vertical-type CMOS image sensor, a method of manufacturing the same, and a method of gettering the same, in which source and drain regions are expanded to improve grounding and gettering effects. In embodiments, the vertical-type CMOS image sensor may include a silicon substrate, a first photodiode formed in a prescribed part of the silicon substrate, a first epitaxial layer formed on the silicon substrate, a second photodiode formed on the first epitaxial layer to overlap the first photodiode, a second epitaxial layer formed on the first epitaxial layer, a third photodiode formed on the second epitaxial layer to overlap the second photodiode, and first to third grounded dummy moats formed by implanting impurities into uniform parts on the silicon substrate, the first epitaxial layer, and the second epitaxial layer.

11 Claims, 6 Drawing Sheets

CMOS IMAGE SENSOR

The present application claims priority under 35 U.S.C. 119 and 35 U.S.C. 365 to Korean Patent Application No. 10-2005-0132718 (filed on Dec. 28, 2005), which is hereby incorporated by reference in its entirety.

BACKGROUND

CMOS image sensors may be semiconductor devices to convert an optical image into an electrical signal. Among various image sensors, a charge coupled device (CCD) may include metal-oxide silicon (MOS) capacitors that may be positioned in close proximity to each other so that charge carriers may be transferred to and stored in the capacitors.

A CMOS image sensor, on the other hand, may include photodiodes corresponding to a number of pixels. Transistors may be electrically connected to the photodiodes, and may open and close channels. A CMOS image sensor may be formed using a CMOS technology that may use a control circuit and a signal processing circuit as peripheral circuits. In addition, red, green, and blue optical signals may be sequentially detected by the transistors, and outputted by a switching method.

The CMOS image sensor may have various advantages such as low power consumption, low process cost, and high degree of integration. A CMOS image sensor may be a replacement for the CCD.

A CMOS image sensor may be divided into various types, according to a number of transistors provided. For example, a CMOS image sensor may be a 3T-type CMOS image sensor, a 4T-type CMOS image sensor, or a 5T-type CMOS image sensor in accordance with the number of transistors. The 3T-type CMOS image sensor may include one photodiode and 3 transistors. The 4T-type CMOS image sensor may include one photodiode and 4 transistors.

The unit pixel of the common 3T CMOS image sensor may be composed of one photodiode (PD) and 3 nMOS transistors T1, T2, and T3. The cathode of the PD may be connected to the drain of first nMOS transistor T1 and the gate of second nMOS transistor T2.

In addition, sources of first and second nMOS transistors T1 and T2 may be connected to a power line feeding a reference voltage VR, and a gate of first nMOS transistor T1 may be connected to a reset line feeding a reset signal RST.

The source of third nMOS transistor T3 may be connected to the drain of the second nMOS transistor. The drain of third nMOS transistor T3 may be connected to a reading circuit (not shown) through a signal line. The gate of third nMOS transistor T3 may be connected to a column selection line to which a selection signal SLCT is supplied.

First nMOS transistor T1 may be referred to as reset transistor Rx, second NMOS transistor T2 may be referred to as drive transistor Dx, and third nMOS transistor T3 may be referred to as selection transistor Sx.

In a related art CMOS image sensor, the PDs and the transistors for driving the PDs may be horizontally formed and the unit pixel may sense light components of the corresponding colors, for example using red, green, and blue color filters.

In a related art CMOS image sensor, since one unit pixel may include all of the red, green, and blue color filters formed on a single plane, a size of the CMOS image sensor may be large. Therefore, in a related art CMOS image sensor, a degree of pixel integration may be degraded.

To solve the degradation of the degree of integration of a related art image sensor, a vertical-type image sensor may be used. In a vertical-type image sensor, red, green, and blue PDs may be vertically aligned and may sense all of red, green, blue signals by a unit pixel.

FIG. 1 is an example diagram illustrating a related art vertical-type image sensor. FIG. 2a illustrates a unit pixel enlargement of FIG. 1. FIG. 3 is an example sectional view of the unit pixel of the related art vertical-type image sensor.

Referring to FIGS. 1 and 2, in vertical-type image sensor 20, PD may include an n+ type doped well, and red, green, and blue PDs may be vertically aligned so as to sense all of the signals by unit pixel.

Vertical-type image sensor 20 may be divided into pixel region 15, where a plurality of unit pixels may be formed, and peripheral region 10, which may include grounding terminal 18 that may apply signals to the devices formed in pixel region 15 and the PDs. Vertical-type image sensor 20 may be subjected to a p+ type source and drain implant process with respect to peripheral region 10 for grounding to be used as a ground (GND) terminal. In embodiments, a p+ type dummy region may exist in the unit pixel (including each of the R, G, and B PDs). The p+ type dummy region may be added to improve the gettering effect of a metal impurity generated in a process on a first or second epitaxial layer that may form vertical-type image sensor 20. The p+ type dummy region may also perform the function of grounding. That is, p+ boron implantation may be applied (for example, Fe—B combination) to a dummy moat region so that a metal ion M+ that may be left on the epitaxial layer may be gettered, which may remove metal ion contamination.

Referring to FIG. 3, the related art vertical type CMOS image sensor may include silicon substrate 1 and first PD 2 formed in a prescribed portion of the silicon substrate. It may further include first epitaxial layer 3 formed on silicon substrate 1, second PD 5 formed on first epitaxial layer 3 which may overlap first PD 2, and second epitaxial layer 6 formed on first epitaxial layer 3. It may further include third PD 9 formed on second epitaxial layer 6 to overlap second PD 5, and grounded dummy moat 10 formed in a prescribed part on second epitaxial layer 6 by implanting p+ type ion impurities.

Device isolation region 7 may define the insulating region of the vertical-type image sensor and may serve to isolate devices.

In the related art vertical-type CMOS image sensor, dummy moat 10 that may provide grounding and/or gettering may be positioned only on a surface of uppermost epitaxial layer (second epitaxial layer) 6, and may remove metal ions that may be present on the second epitaxial layer 6 and to perform grounding. However, gettering or grounding means for lower epitaxial layer (first epitaxial layer) 3 or the substrate may not exist.

However, due to the vertical configuration of the epitaxial layers, on which photodiodes may be formed, the related art vertical-type CMOS image sensor may have various problems.

For example, the grounding process may be applied to only the upper epitaxial region (p-well region) on which the uppermost PD may be formed. That is, grounding may not be performed on the lower epitaxial layer and on the semiconductor substrate so that the vertical-type CMOS image sensor may be vulnerable to the noise caused by the resistance component of the ground path during a sensor operation.

In addition, in view of gettering, although the dummy moat region, into which impurities different from the PD may be implanted, may be provided on the upper most epitaxial layer on which the third PD may be formed, it may be insufficient to gettering the silicon substrate on which the first and second PDs may be formed or the metal impurity M+ that exists in the epitaxial layer.

SUMMARY

Embodiments relate to an image sensor. Embodiments relate to a vertical-type CMOS image sensor, a method of manufacturing the same, and a method of gettering the same, in which source and drain regions may be expanded to improve grounding and gettering effects.

In embodiments, a vertical-type CMOS image sensor may include a silicon substrate, a first photodiode formed in a prescribed part of the silicon substrate, a first epitaxial layer formed on the silicon substrate, a second photodiode formed on the first epitaxial layer to overlap the first photodiode, a second epitaxial layer formed on the first epitaxial layer, a third photodiode formed on the second epitaxial layer to overlap the second photodiode, and first to third grounded dummy moats formed by implanting impurities into uniform parts on the silicon substrate, the first epitaxial layer, and the second epitaxial layer.

In embodiments, a first impurity ion may be implanted into the first to third photodiodes and a second impurity ion may be implanted into the first to third dummy moats. In embodiments, the first impurity ion may be n+ type and the second impurity ion may be p+ type. The second impurity ion may be boron (B). In embodiments, the first to third dummy moats may be connected to external grounding terminals.

In embodiments, a method of manufacturing a vertical-type CMOS image sensor may include forming a first photodiode in a prescribed part on a silicon substrate, forming a first dummy moat into which a first impurity may be implanted in a part on the silicon separated from the first photodiode, forming a first epitaxial layer formed on the silicon substrate, forming a second photodiode in a part that overlaps the first photodiode of the first epitaxial layer, forming a second dummy moat into which the first impurity may be implanted in a part on the silicon separated from the second photodiode, forming a second epitaxial layer on the first epitaxial layer, forming a third photodiode in the part that overlaps the second photodiode of the second epitaxial layer, and forming a third dummy moat into which the first impurity may be implanted in a part on the silicon separated from the second photodiode.

In embodiments, a first photodiode may be formed in a prescribed part of the silicon substrate, a first epitaxial layer formed on the silicon substrate, a second photodiode formed on the first epitaxial layer to overlap the first photodiode, a second epitaxial layer formed on the first epitaxial layer, a third photodiode formed on the second epitaxial layer to overlap the second photodiode, and first to third grounded dummy moats formed by implanting impurities into uniform parts on the silicon substrate, the first epitaxial layer, and the second epitaxial layer, the first to third dummy moats are connected to external grounding terminals. A first impurity ion may be implanted into the first to third photodiodes and a second impurity ion may be implanted into the first to third dummy moats. The first impurity ion is n+ type and the second impurity ion is p+ type.

DETAILED DESCRIPTION OF EMBODIMENTS

Figure 1:
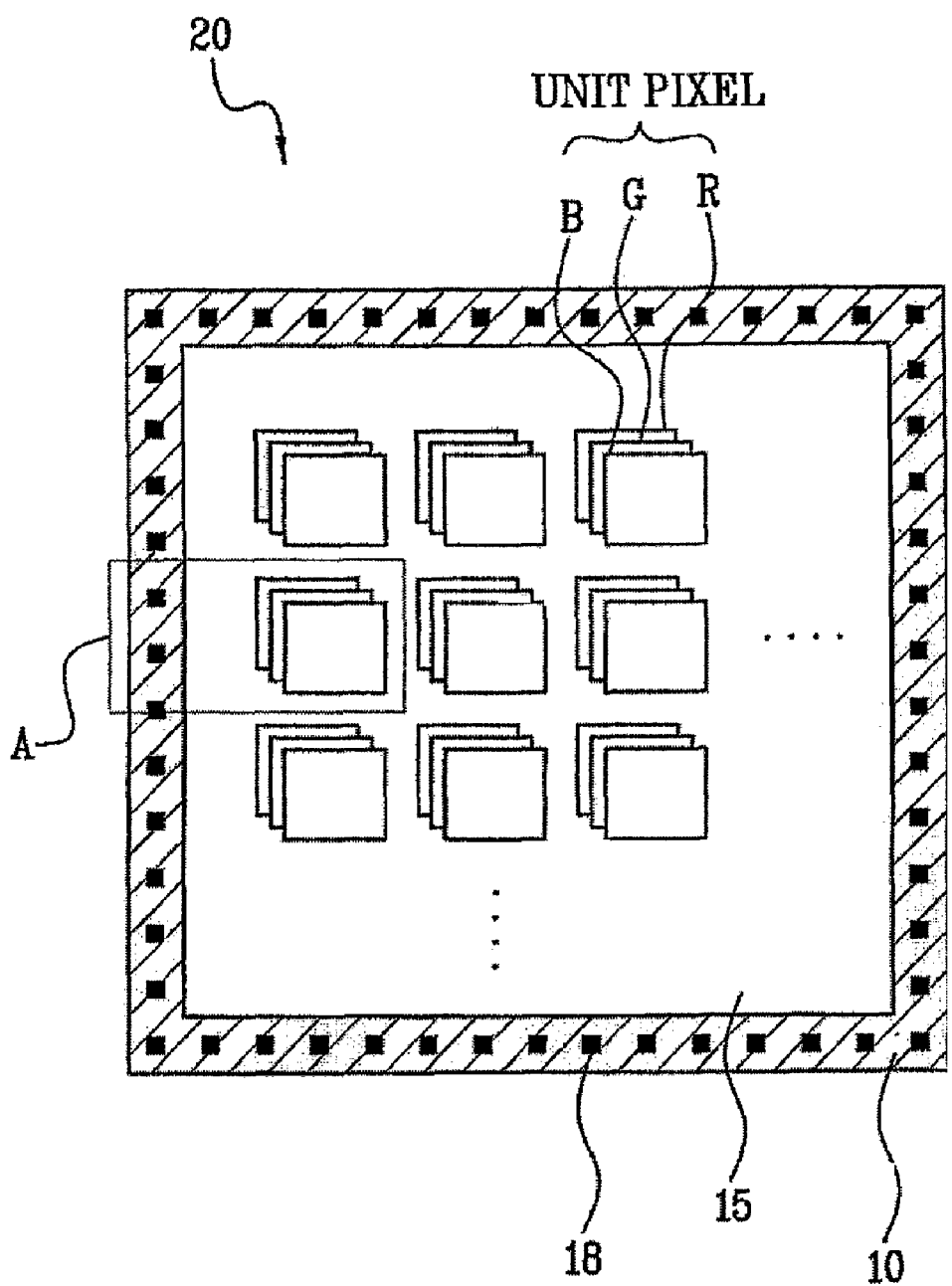
FIG. 1 is an example illustration of a related art vertical-type image sensor.
Figure 2:
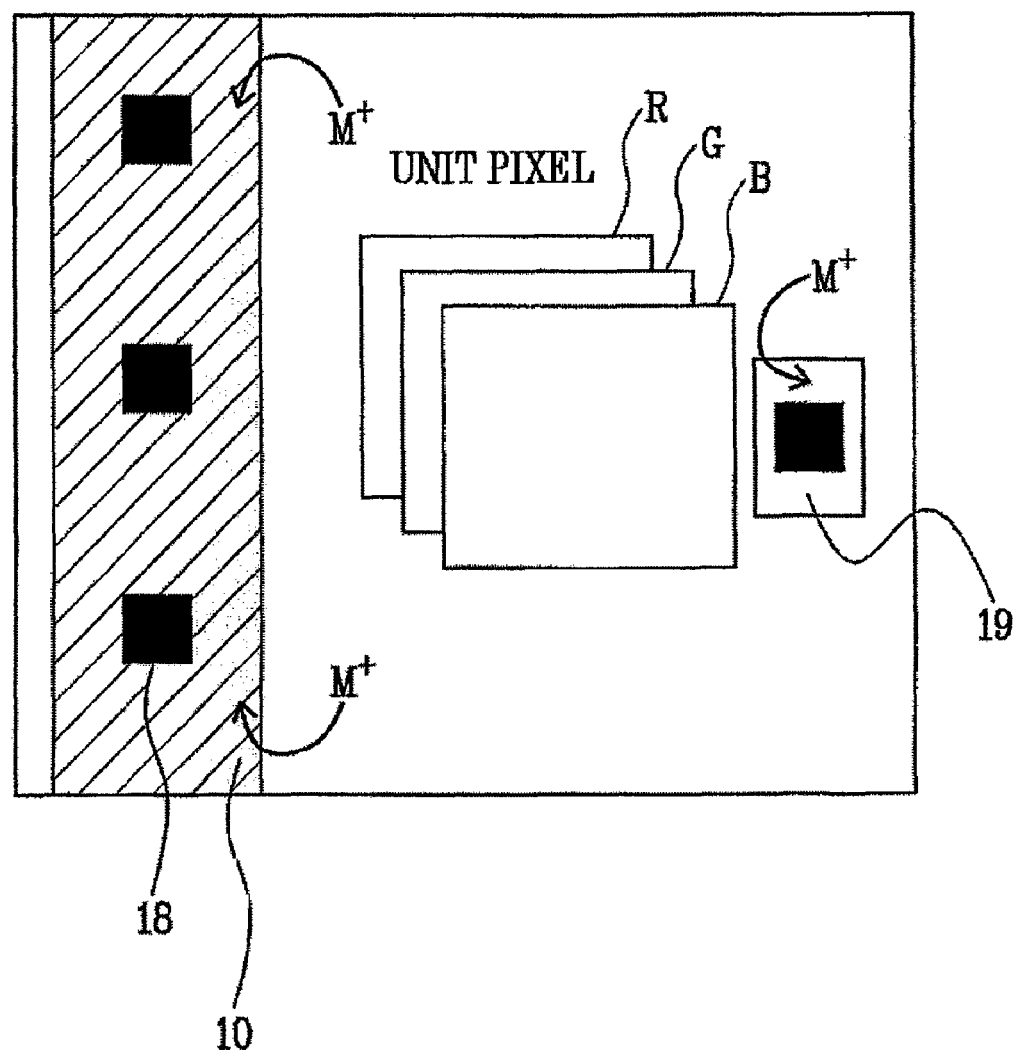
FIG. 2 illustrates an enlargement of the unit pixel of FIG. 1.
Figure 3:
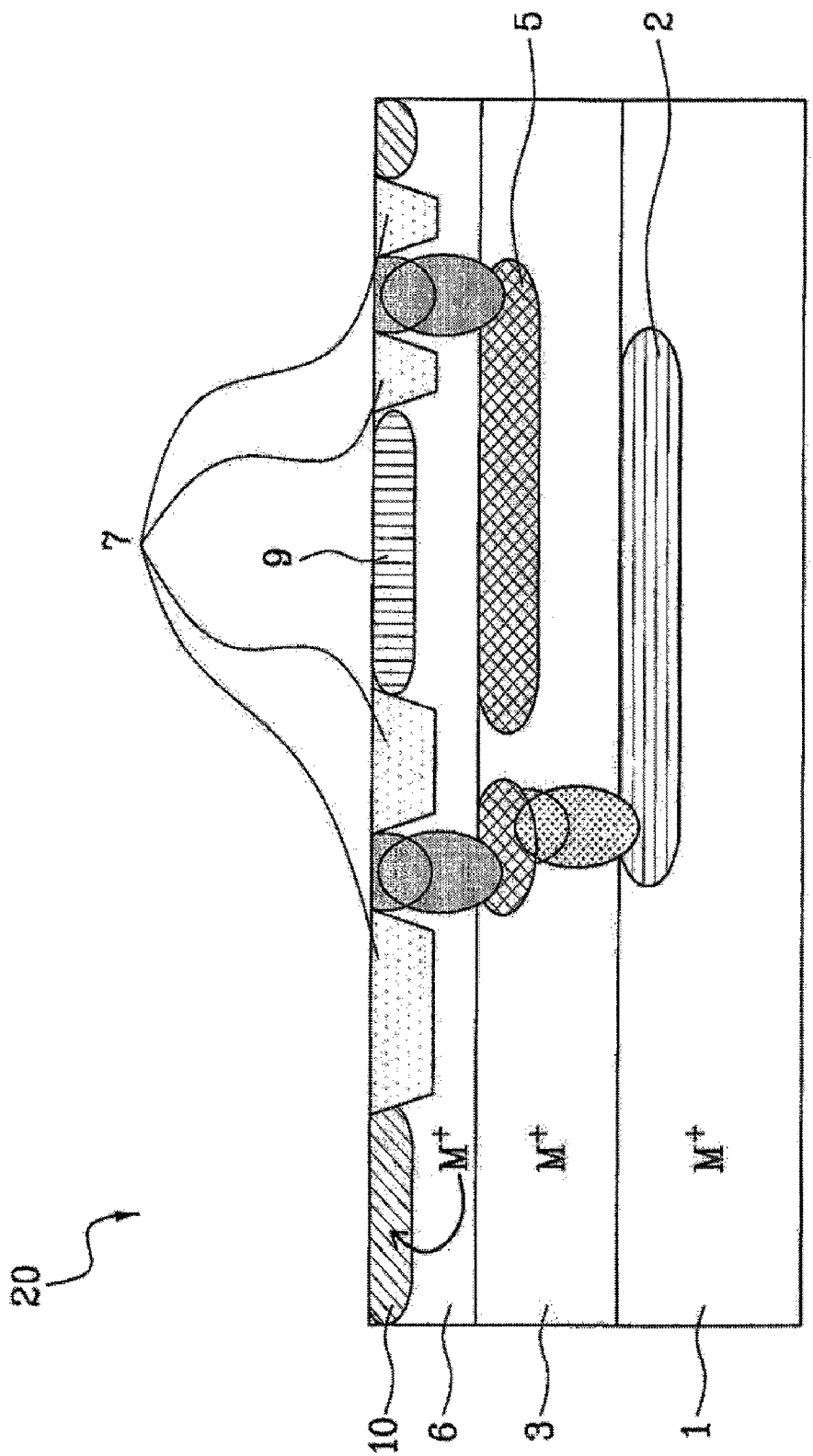
FIG. 3 is an example sectional view of a unit pixel of a related art vertical-type image sensor.
Figure 4:
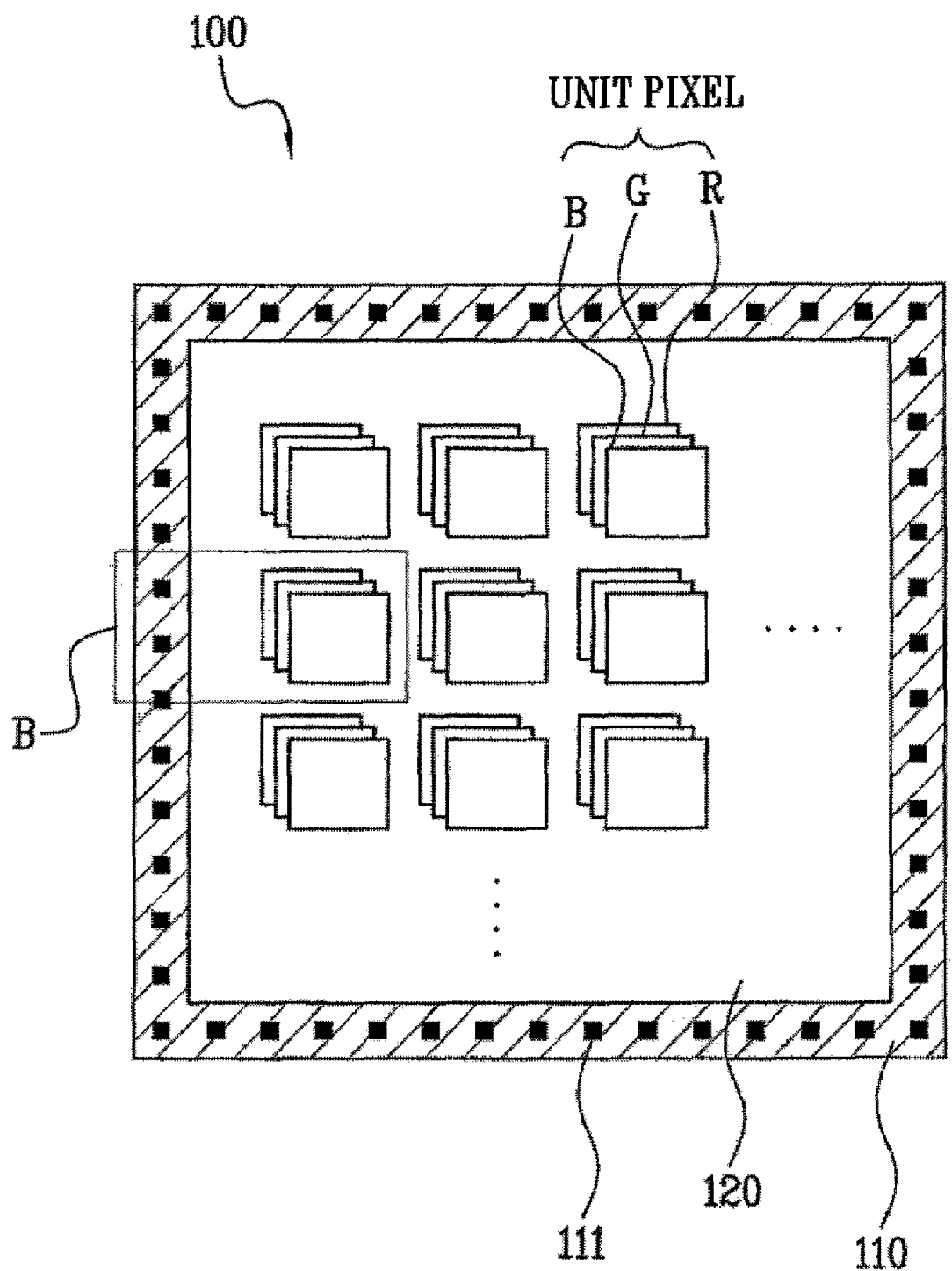
FIG. 4 is an example illustration of a vertical-type image sensor according to embodiments.
Figure 5:
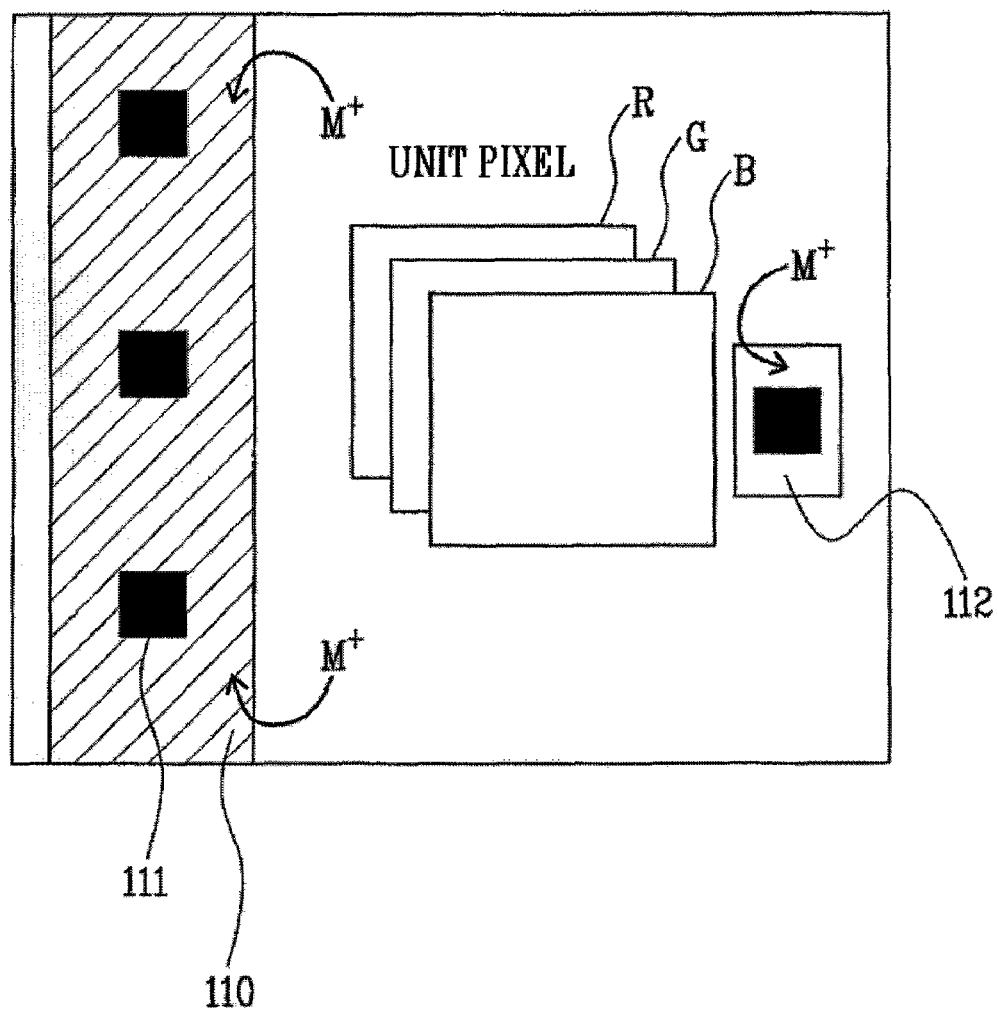
FIG. 5 illustrates an enlargement of the unit pixel of FIG. 4.

Referring to FIGS. 4 and 5, in vertical-type image sensor 100 according to embodiments, a photodiode (PD) may be an n+ type doped well. Red, green, and blue PDs may be vertically aligned so as to sense all of the light signals by unit pixel.

In embodiments, vertical-type image sensor 100 may be divided into pixel region 120 and peripheral region 110. Pixel region 120 may include a plurality of unit pixels, and peripheral region 110 may include grounding terminal 111, that may apply signals to the devices formed in pixel region 120 and the PDs. In embodiments, vertical-type image sensor 100 may be subjected to a p+ type source and drain implant process to form peripheral region 110 for grounding, which may be used as a grounding (GND) terminal. In particular, p+ type dummy region (112, 110, 113, and 115 in FIG. 6) that exists in the unit pixel (including each of the R, G, and B PDs) may be added to improve the gettering effect of metal impurities that may be generated in a process on first or second epitaxial layer 103 or 106 that makes up vertical-type image sensor 100. The p+ type dummy region may also perform the function of grounding. That is, p+ boron implantation may be applied (for example, Fe—B combination) to dummy moat region 110 so that a metal ion M+ that may be left on the epitaxial layer may be gettered. Metal ion contamination may therefore be removed.

Figure 6:
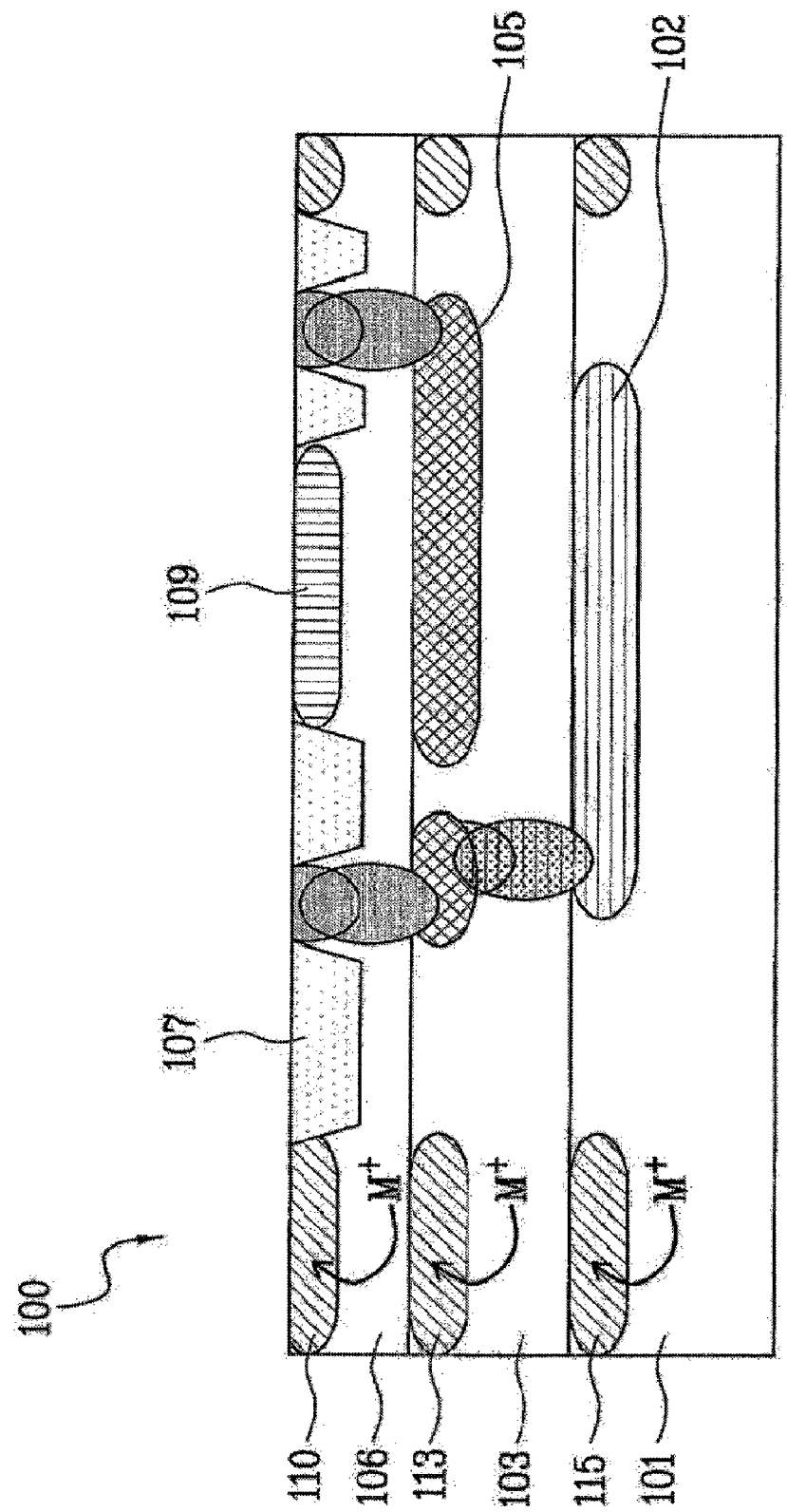
FIG. 6 is an example illustration of a unit pixel of a vertical-type image sensor according to embodiments.

Referring to FIG. 6, the vertical type CMOS image sensor according to embodiments may include silicon substrate 101 and first PD 102 formed in a prescribed portion of silicon substrate 101. It may further include first epitaxial layer 103 formed on silicon substrate 101, second PD 105 formed on first epitaxial layer 103 to overlap first PD 102, and second epitaxial layer 106 formed on first epitaxial layer 103. It may further include third PD 109 formed on second epitaxial layer 106 to overlap second PD 105. It may also include first, second, and third grounded dummy moats 115, 113, and 110, which may be formed by implanting p+ type ion impurities in the second epitaxial layer to be separated from the corresponding PDs of the silicon substrate, and the first and second epitaxial layers. In embodiments, dummy moat 115 may be provided in semiconductor substrate 101.

Device isolation region 107 may be provided and may define the insulating region of the vertical-type image sensor and that may provide isolation between devices.

In embodiments, first, second, and third PDs 102, 105, and 109 may sense red, green, and blue, respectively.

In embodiments, a pixel array composed of the PDs may sense light and may convert the sensed light into an optical signal. Also, the CMOS image sensor may occupy the largest region so that the design of a pixel represents the performance of the CMOS image sensor.

In the vertical-type CMOS image sensor according to embodiments, in picture quality, to effectively ground and getter the pixel region, dummy moats 115, 113, and 110, into which the p+ type impurities may be implanted, may be formed for silicon substrate 101 and first and second epitaxial layers 103 and 106 on which the PDs may be formed. In the related art, since the dummy moat regions may be locally applied to only the upper epitaxial layer ($2^{nd}$ epitaxial layer), the lower epitaxial layer on which red and green PDs may be formed may not be well grounded and gettered.

According to embodiments, to solve this problem, a p+ type source and drain impurity ion implantation process may be additionally performed on substrate 101 and epitaxial layers 103, 106. The impurity ion may thus be enlarged from the total region of pixel region 120 and initial silicon substrate 101 to second epitaxial layer 106, that is the uppermost epitaxial layer. This may maximize the grounding and gettering effects. In embodiments, the n+ type ion may be implanted into the PDs, respectively.

That is, in the vertical-type CMOS image sensor according to embodiments, the p-type ion (for example, boron) may be implanted into silicon substrate 101 and first and second epitaxial layers 103 and 106. It may be implanted using dummy moat regions 115, 113, and 110, which may be on the grounded part of pixel region 120, as p+ type implantation masks.

In the vertical-type CMOS image sensor according to embodiments, dummy moat regions 110, 113, and 115, into which the p+ type impurities may be implanted, may be connected to external grounding terminals to getter and ground any metal ion M+ that may remain on silicon substrate 101 and first and second epitaxial layers 103 and 106.

In embodiments, in the vertical-type CMOS image sensor, after performing gettering, the p regions (the dummy moat regions) of the 3 n+ type PDs that may exist on the epitaxial layers may be made to have the same potential. Therefore, it may be possible to reduce noise.

In embodiments, metal contamination that may remain on the epitaxial layers due to the two necessary additional epitaxial processes may be effectively gettered in the dummy moat regions of the epitaxial layers.

In embodiments, the vertical-type CMOS image sensor, the method of manufacturing the same, and the method of gettering the same may have various advantages.

For example, in the vertical-type CMOS image sensor according to embodiments, the grounded parts of the silicon substrate and the epitaxial layers on which the PDs may be formed may be defined as dummy moat regions. Impurity ions of different type than the ion type of the PDs may be implanted into the dummy moat regions, and the dummy moat regions may be connected to the external grounding terminals. It may therefore be possible to improve the grounding and gettering effects.

Moreover, in the vertical-type CMOS image sensor according to embodiments, since the p regions (the dummy moat regions) of the three n+ type PDs that may exist on the epitaxial layers may be made to have the same potential, it may be possible to reduce noise.

In addition, any metal contamination that may remain on the epitaxial layers due to the necessary two additional epitaxial processes may be effectively gettered in the dummy moat regions of the epitaxial region.

Furthermore, it may be possible to reduce the noise and leakage current that may be generated in the pixel regions. Therefore, the number of faulty pixels, such as white pixels and dead pixels, that may be generated when an image is realized may be reduced. This may improve an image quality.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A device, comprising:
    a silicon substrate;
    a first photodiode formed in a prescribed part of the silicon substrate;
    a first epitaxial layer formed over the silicon substrate;
    a second photodiode formed on the first epitaxial layer to overlap the first photodiode;
    a second epitaxial layer formed on the first epitaxial layer;
    a third photodiode formed on the second epitaxial layer to overlap the second photodiode; and
    first, second, and third dummy moats formed by implanting impurities into uniform parts on the silicon substrate, the first epitaxial layer, and the second epitaxial layer, wherein:
    the first dummy moat is floating below a surface of the silicon substrate;
    the second dummy moat is floating below a surface of the first epitaxial layer; and
    the third dummy moat is floating below a surface of the second epitaxial layer.

2. The device of claim 1, wherein the first, second, and third dummy moats are grounded.

3. The device of claim 1, wherein a first impurity ion is implanted into the first, second, and third photodiodes, and wherein a second impurity ion is implanted into the first, second, and third dummy moats.

4. The device of claim 3, wherein the first impurity ion comprises an n+ type, and wherein the second impurity ion comprises a p+ type.

5. The device of claim 4, wherein the second impurity ion comprises boron (B).

6. The device of claim 1, wherein the first, second, and third dummy moats are electrically connected to external grounding terminals.

7. A device, comprising:
    a silicon substrate including a photodiode;
    a plurality of epitaxial layers formed over the silicon substrate, each epitaxial layer including a photodiode; and
    a plurality of first dummy moats formed in respective ones of the plurality of epitaxial layers by implanting impurities, wherein each of the plurality of first dummy moats is floating below a surface of the plurality of epitaxial layers.

8. The device of claim 7, further comprising a second dummy moat formed in the silicon substrate, wherein the second dummy moat is floating below a surface of the silicon substrate.

9. The device of claim 8, where in each of the photodiodes is configured to overlap with a photodiode in an adjacent layer, and wherein each of the plurality of first dummy moats and the second dummy moat are formed away from the corresponding photodiode formed on respective layers.

10. The device of claim 9, wherein a first impurity ion is used to form each of the photodiodes, and where in a second impurity ion is used to form each of the dummy moats.

11. The device of claim 10, wherein each of the dummy moats is grounded.

* * * * *